(12) United States Patent
Sugaya et al.

(10) Patent No.: US 7,001,662 B2
(45) Date of Patent: Feb. 21, 2006

(54) TRANSFER SHEET AND WIRING BOARD USING THE SAME, AND METHOD OF MANUFACTURING THE SAME

(75) Inventors: Yasuhiro Sugaya, Toyonaka (JP); Hiroyuki Ishitomi, Takatsuki (JP); Seiichi Nakatani, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/804,612

(22) Filed: Mar. 18, 2004

(65) Prior Publication Data

US 2004/0191491 A1    Sep. 30, 2004

(30) Foreign Application Priority Data

Mar. 28, 2003    (JP) .............................. 2003-091149

(51) Int. Cl.
  *B32B 7/12*    (2006.01)
(52) U.S. Cl. ...................... 428/344; 428/209; 428/352; 428/353; 428/609; 428/612; 156/329
(58) Field of Classification Search ................ 156/329; 428/344, 352–353, 209, 609, 612
  See application file for complete search history.

(56) References Cited

U.S. PATENT DOCUMENTS

| 4,639,285 | A | * | 1/1987 | Suzuki et al. ............ 156/272.6 |
| 5,677,393 | A | * | 10/1997 | Ohmori et al. ............. 525/423 |
| 5,863,666 | A | * | 1/1999 | Merchant et al. ........... 428/544 |
| 6,195,882 | B1 | | 3/2001 | Tsukamoto et al. |
| 6,207,259 | B1 | * | 3/2001 | Iino et al. .................... 428/209 |
| 6,245,696 | B1 | * | 6/2001 | Haas et al. ................. 442/348 |
| 6,359,235 | B1 | * | 3/2002 | Hayashi ..................... 174/260 |
| 6,413,620 | B1 | * | 7/2002 | Kimura et al. ............. 428/210 |
| 6,451,441 | B1 | | 9/2002 | Nishimoto et al. |
| 6,855,892 | B1 | * | 2/2005 | Komatsu et al. ............ 174/256 |

FOREIGN PATENT DOCUMENTS

| JP | 10-51108 | 2/1998 |
| JP | 10-84186 | 3/1998 |
| JP | 2002-111203 | 4/2002 |
| JP | 2002-359455 | 12/2002 |

\* cited by examiner

*Primary Examiner*—Cathy F. Lam
(74) *Attorney, Agent, or Firm*—Hamre, Schumann, Mueller & Larson, P.C.

(57) ABSTRACT

A transfer sheet of the present invention includes a resin film having a glass transition temperature of not lower than 60° C., a silicone resin layer formed on the resin film, and a metal wiring pattern formed on the silicone resin layer. The metal wiring pattern has an exposed face that forms a roughened face, and the roughened face has a ten-point average surface roughness (Rz) of 2 $\mu$m or more, while a face of the wiring pattern, which is in contact with the silicone resin layer, has a surface roughness (Rz) lower than that of the exposed face. Thereby, the present invention provides a transfer sheet that has improved transfer performance for enabling transferring at low temperature, and improved dimensional stability and also a via-connection reliability. The present invention provides also a wiring board using the transfer sheet and a method of manufacturing the same.

6 Claims, 3 Drawing Sheets

TRANSFER SHEET AND WIRING BOARD USING THE SAME, AND METHOD OF MANUFACTURING THE SAME

FIELD OF THE INVENTION

The present invention relates to a transfer sheet for forming a conductive circuit such as a semiconductor package and a wiring board, a wiring board using the transfer sheet, and a method of manufacturing the same.

BACKGROUND OF THE INVENTION

Recently, electronic equipment has been miniaturized. The development of personal digital assistants and mobile computers has accelerated the miniaturization demand, and thus multilayer wiring boards to be packaged in such electronic equipment are required to have further functions, be thinner and have fine wiring patterns.

Electronic equipment such as communications equipment is required to operate at high speed. Therefore, multilayer printed boards should also correspond to the high-speed operation. For this purpose, the wiring length is reduced, and at the same time, wiring width and pitches are decreased so as to shorten the time for conveying electric signals. That is, a multilayer board should be small, thin and densified.

For proceeding with high-density packaging of multilayer boards, formation of fine wiring pattern is emphasized. In a typical printed wiring board, for example, a subtractive method of forming a wiring pattern is known. In the subtractive method, a copper foil having a thickness of about 18 $\mu$m to about 35 $\mu$m is chemically etched to form a wiring pattern on a substrate. It is said that even this method has a difficulty in volume-producing a wiring pattern having a line width of 75 $\mu$m or less. For providing a finer wiring pattern, the thickness of the copper foil should be decreased.

Since a wiring pattern formed by the subtractive method protrudes from the substrate surface, solder or a conductive adhesive for electric connection is difficult to dispose on a bump formed on a semiconductor. The bump may shift to a space between wiring patterns and cause a short circuit. The protruding wiring pattern may be an obstacle in a subsequent step of sealing with resin.

For example, JP10(1998)-84186 A describes a method of forming previously a fine wiring pattern on a separable film, and transferring only the wiring pattern to a desired substrate.

For securing transfer performance of the wiring pattern, JP10(1998)-51108 A or the like discloses a method of previously heating a separable film so as to prevent dimensional error caused by shrinkage of the separable film at transferring.

For securing transfer performance of the wiring pattern similar to the above JP10-51108 A, JP2002-111203 A or the like discloses a method of forming a metal foil on a separable film via an adhesive layer, and adjusting the tensile strength of the metal foil so as to manufacture a reliable wiring board with a good yield. The wiring board hardly causes any positional deviation at the time of transferring.

JP 2002-359455 A or the like describes use of silicone for an adhesive layer provided on a separable film as in the above-described transferring, since silicone is not aged, and it is superior in chemical resistance. This technique provides excellent patterning retention at the time of wiring formation by etching or the like.

This technique is useful in avoiding a problem of protrusion of a wiring pattern, since a substrate with a wiring pattern embedded thereon has a planar surface.

However, when transferring a fine wiring by this method, dimensional errors will occur among the transferred wirings when a cost-effective polyethylene terephthalate (PET) or the like is used, and this causes connection failures with vias or with a semiconductor bump. For addressing this problem, JP10-51108 A, JP2002-111203 A and JP2002-359455 A disclose techniques for correcting the dimensional change or for suppressing the shrinkage caused by heat at transferring to be 0.05% or less by previously heating the separable film.

Since relatively high heat is applied at the time of transferring the wiring pattern onto a substrate by using a separable film (for example, temperature of 80° C. to 170° C. is described), a conductive paste often can be cured at a time of transferring a wiring pattern on a prepreg sheet in a stage 'B' having viaholes filled with the conductive paste.

In the conventional technique as mentioned above, a plurality of prepreg sheets (wiring patterns are embedded therein) with a cured conductive paste are laminated and subjected to heat and pressure so as to cure the plural prepreg sheets in a batch, thereby manufacturing a multilayer wiring board. Problems in the manufacturing method are, for example, non-uniform pressure can be applied to the sheets or close contact with the wiring pattern can deteriorate due to the cured conductive paste at the time of curing the laminated sheets in a batch, which will cause disadvantages in obtaining a via-connection.

That is, a package using the conventional transferring material has difficulty in satisfying all of the requirements, that is, the transfer performance, the dimensional stability, and the via-connection reliability.

SUMMARY OF THE INVENTION

For solving the above-described problems, an object of the present invention is to provide a transfer sheet with improved transfer performance for realizing transferring at low temperature and also having improved dimensional stability and a via-connection reliability, a wiring board using the transfer sheet and a method of manufacturing the same.

The transfer sheet according to the present invention includes a resin film having a glass transition temperature of not lower than 60° C., a silicone resin layer formed on the resin film, and a metal wiring pattern formed on the silicone resin layer. The metal wiring has an exposed surface that is roughened, and the roughened surface has a ten-point average surface roughness (Rz) of 2 $\mu$m or more, and the surface roughness (Rz) is lower at a part where the metal wiring pattern is in contact with the silicone resin layer than the surface roughness (Rz) of the exposed surface.

A circuit board according to the present invention includes an electrical insulating substrate sheet in which a hole is formed in the thickness direction and filled with a conductor, and a metal wiring pattern electrically connected with the conductor is integrated by transferring onto at least one of the surface and the back face of the sheet. The interface of the metal wiring pattern being in contact with a resin forms a roughened face, and the roughened face has a ten-point average surface roughness (Rz) of 2 $\mu$m or more, which is higher than the surface roughness (Rz) at a part where the metal wiring is not embedded.

A method of manufacturing a circuit board according to the present invention comprises: superposing, on an electrical insulating substrate sheet, a transfer sheet comprising a resin film having a glass transition temperature of not lower than 60° C., a silicone resin layer formed on the resin film, and a metal wiring pattern formed on the silicone resin layer, where the metal wiring pattern has an exposed surface that has been roughened, and the roughened surface has a ten-point average surface roughness (Rz) of 2 μm or more, and the surface roughness (Rz) of the metal wiring pattern is lower at a part contacted with the silicone resin layer than at the exposed part; applying pressure while heating to a temperature at which the wiring pattern can be embedded in the insulating substrate sheet so as to embed at least one part of the wiring pattern in the insulating substrate sheet; and peeling the resin film so as to provide a wiring board with the embedded wiring pattern.

DETAILED DESCRIPTION OF THE INVENTION

Figure 1B:
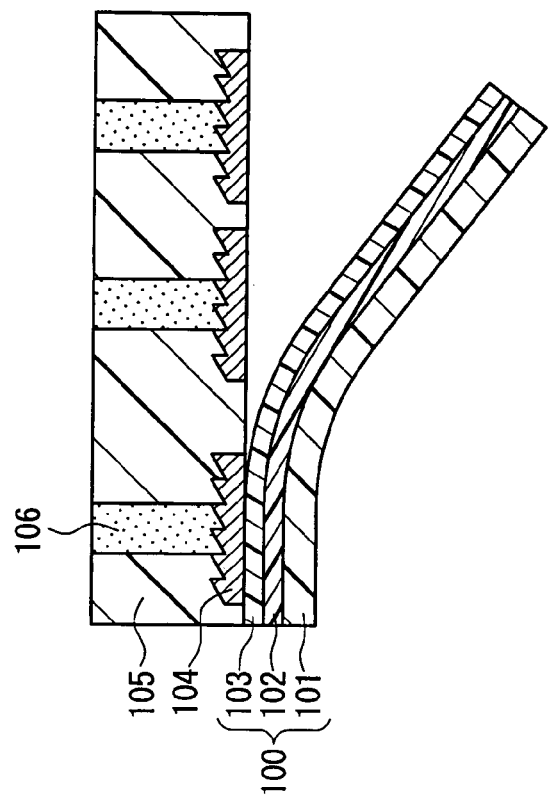
FIGS. 1A and 1B are cross-sectional views to show a transferring material according to a first embodiment of the present invention, and a wiring pattern formation resin sheet using the same.

In the present invention, a resin film having a glass transition point of not lower than 60° C. is prepared, and a wiring pattern, formed by roughening a metal foil at a transfer side is provided onto the resin film via a silicone resin layer, thereby obtaining a transfer sheet. By using the transfer sheet, the wiring pattern can be transferred to an uncured resin sheet or the like even at low temperature of about 60° C. to 80° C. at which complete curing of a conductive paste does not start. As a result, a transfer process can be carried out substantially without curing the via-paste, and this results in a good via-connection reliability in a multilayer substrate formed by a batch lamination and curing that are carried out subsequent to the transferring process.

Namely, a transfer sheet according to the present invention includes a resin film having a glass transition temperature of not lower than 60° C., a silicone resin layer formed on the resin film, and a metal wiring pattern formed on the silicone resin layer. The metal wiring pattern has a roughened surface whose average surface roughness (Rz) is at least 2 μm, and the roughness (Rz) of the back face is lower than that of the surface. The surface roughening may be carried out by electroplating and depositing metal particles. For the metal foil, a rolled copper foil is preferred further for the excellent flexibility. An example of a copper foil provided with unevenness of the deposited particles due to plating is a "STD type"(trade name) supplied by Furukawa Circuit Foil Co., Ltd. It is preferable that the metal wiring pattern is a copper foil, and that the resin film is a PET film. The production cost can be decreased by using PET, and thus the transfer material will be used widely.

It is preferable that the surface of the metal wiring pattern is subjected to a silane-coupling treatment, thereby improving the retention at the time of forming the wiring pattern and also the transfer performance.

When treating the surface of the copper foil, it is preferable to carry out a Zn plating alone. Typically, any other processes such as Ni plating or chroming are not needed. The Zn plating is useful in corrosion resistance and obtaining a good via-connection.

It is also preferable that the surface roughness (Rz) of the roughened surface is from 3 μm to 8 μm. The metal wiring facing a carrier sheet (resin film) has a surface roughness (Rz) ranging from 0.5 μm to 1.5 μm, more preferably from 0.6 μm to 1.2 μm.

It is also preferable that a primer layer is further interposed between the resin film and the silicone resin layer, so that the adhesive strength between the resin film and the silicone resin layer is improved.

In a circuit board according to the present invention, the metal wiring pattern forms a roughened face at the interface in contact with a resin. The roughened face can be embedded in the resin, or any part of the sidewall of the wiring pattern can be exposed. The roughened face has a ten-point average surface (Rz) of at least 2 μm. Thereby, an electrical and mechanical connection between the pattern and the conductor formed in the thickness direction of the sheet can be improved. Namely, the unevenness of the metal wiring surface provides an anchoring effect to strengthen the bonding.

It is preferable that a method of manufacturing a wiring board includes, at least: preparing a transfer sheet, superposing the transfer sheet on an insulating substrate sheet, laminating the sheets by applying heat from 40° C. to 80° C., embedding the wiring pattern in the insulating substrate sheet, peeling the resin film, and thus obtaining an insulating substrate sheet with the wiring pattern embedded in the surface of the insulating substrate sheet. An alternative method of manufacturing a wiring board includes, at least: a step of preparing a transfer sheet, the step including forming a silicone layer on a resin film having a glass transition temperature of not lower than 60° C., and forming on the silicone a wiring pattern having a roughened surface whose surface roughness Rz is 2 μm or more; a step of preparing an insulating substrate sheet having viaholes filled with a conductive paste; a step of embedding the wiring pattern in the insulating substrate sheet, the step including superposing the wiring pattern of the transfer sheet on the insulating substrate sheet so as to be connected to the conductive paste, and laminating the sheets by applying heat lower than the cure reaction peak temperature of the conductive paste; and a step of peeling the resin film so as to obtain an insulating substrate sheet with the wiring pattern embedded in the surface of the insulating substrate sheet.

In general, the transferring process is difficult to perform at low temperature. The manufacturing method as mentioned above enables forming a wiring pattern at low temperature. As a result, a dimensional change at the time of transferring can be suppressed to 0.05% or less even when using a separable film of PET or the like.

It is preferable that the conductive paste is filled in the viaholes and that the transfer sheet is superposed on the insulating substrate sheet so that the wiring pattern of the transfer sheet is connected to the conductive paste of the insulating substrate sheet.

An alternative method includes at least a step of preparing a plurality of the insulating substrate sheets, and laminating and curing the insulating substrate sheets in a batch.

According to the present invention, as the wiring pattern can be transferred at low temperature, a via-paste that is filled previously in a prepreg as an object in a stage B (semi-cured) is not cured substantially. As a result, curing of the conductive paste can be carried out at a time of the batch curing, and an excellent via-connection reliability will be obtained.

As mentioned above, a transfer material according to the present invention is useful in obtaining a wiring board that has excellent transfer performance at low temperature. As a result, a dimensional change in the wiring board is suppressed and also an excellent reliability with an excellent via-connection reliability is secured at a time of a batched curing.

Embodiments

Specific embodiments of the present invention will be described below by referring to the attached drawings. The embodiments are to be considered as not limiting.

(First Embodiment)

Figure 1A:
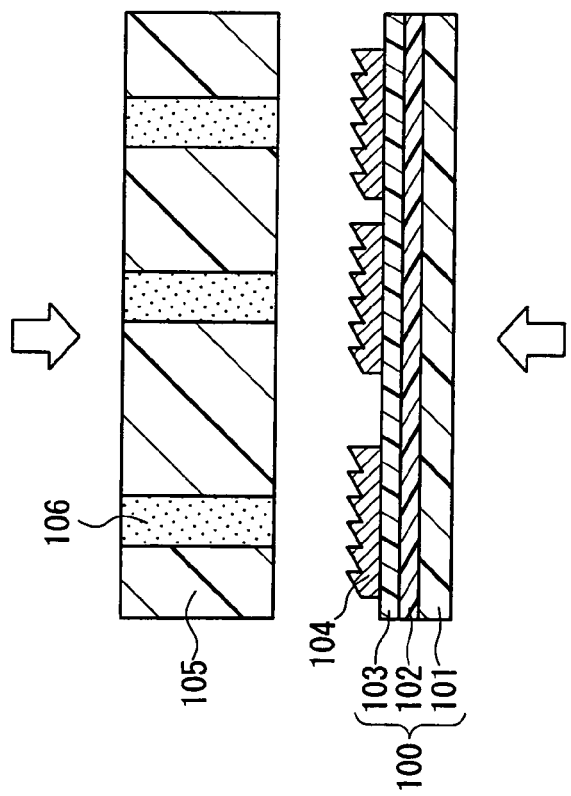

FIGS. 1A and 1B are cross-sectional views to show an example of a transfer sheet according to the present invention and a transferring method using the transfer sheet. As shown in FIG. 1A, a transfer sheet 100 in this embodiment has a supporter 101 made of a resin film, a cured silicone resin layer 103 formed on the supporter 101 via a primer layer 102, and a wiring pattern 104 formed on the silicone resin layer 103. The supporter 101 has a glass transition temperature of 60° C. or higher.

After forming the wiring pattern 104, the transfer sheet 100 is superposed on an insulating substrate sheet so that the wiring pattern 104 will face the insulating substrate sheet. The wiring pattern is embedded, at least partially, in the insulating substrate sheet so as to transfer the wiring pattern 104, and then the supporter 101 is peeled away (FIG. 1B). At this time, since the silicone resin layer 103 is also peeled with the supporter 101, only the wiring pattern 104 is transferred. This contributes to the elimination of some complicated processes adopted in the conventional techniques, such as a heating step or an ultraviolet irradiation step for react-curing a pressure-sensitive layer after transferring the wiring pattern.

The supporter 101 used in the present invention can be made of a metal foil of aluminum, copper, stainless steel or the like. From an aspect of convenience in handling, a resin film is preferred.

From an aspect of chemical resistance, thermal resistance and strength, the resin film is preferably made of, for example, polyester resins such as polyethylene terephthalate and polyethylene naphthalate, polyimide, polypropylene, and polyphenylene sulfide.

In the transfer sheet of the present invention, bond strength between the supporter 101 such as a resin film and the cured silicone resin 103 is important. For further improving this bond strength, a primer layer 102 as an adhesive layer can be provided before applying the silicone resin 103 on the resin film 101, though the primer layer 102 is not an essential component. Alternatively, surface treatments such as a plasma treatment can be carried out in place of or in addition to application of a primer layer.

Though the primer layer 102 is not limited specifically as long as it can improve the bond strength between the resin film and the silicone resin, for example, liquid epoxy resin and resins based on polyurethane, polyester/cellulose, or resins containing a silyl group, can be used. The primer layer has a thickness of 0.1 $\mu$m to 100 $\mu$m, or more preferably, of 0.5 $\mu$m to 10 $\mu$m. When the thickness of the primer is insufficient, defects such as pin holes often occur during a coating step, while an extremely thick layer will raise the material cost, causing disadvantages in cost effectiveness.

The silicone resin layer 103 can be obtained by a condensation-reaction, or an addition reaction using a catalytic action of metal or the like.

To a condensation silicone rubber, a compound containing metal such as zinc, lead, calcium, and manganese can be added for a catalyst.

For an addition silicone rubber, a catalyst such as platinum as an element, platinum chloride and an olefin coordinated platinum can be used.

In general, the silicone resin layer 103 has a thickness of 0.5 $\mu$m to 10 $\mu$m, or more preferably, of 1 $\mu$m to 5 $\mu$m. An extremely thin silicone resin layer may cause a problem of non-uniformity in the bond with the metal foil. When the layer is too thick, the material cost is raised, which will reduce the cost effectiveness.

Examples of the metal foil in the present invention include copper, aluminum, gold, silver, and stainless steel. Among them, a foil of copper or an alloy containing copper is preferred from an aspect of the conductivity, the etching performance, and the cost.

The metal foil has a thickness ranging in general from 9 $\mu$m to 35 $\mu$m, or preferably, from 12 $\mu$m to 30 $\mu$m. A thickness over 35 $\mu$m is not preferable since the capability of the silicone resin layer to hold the metal foil becomes unstable and thus a part of the metal foil may drop at the time of etching for forming the wiring pattern.

For superposing the metal foil on the silicone resin layer 103, heat and/or pressure is applied by using a press, a roll laminater, or the like. The heat, pressure or the like to be applied can be selected suitably corresponding to the object.

For the wiring pattern 104, a predetermined circuit pattern is formed by a wide-known method such as a photoresist method, and wiring-patterning is carried out by etching or the like.

It is preferable that the surface of the first metal layer is roughened for transferring. For example, it is preferable that the centerline average roughness (Ra) is 1 $\mu$m or more, and the ten-point average surface roughness height (Rz) is 2 $\mu$m or more. When the Rz is less than 2 $\mu$m, the strength to bond to the substrate for transferring may deteriorate to a degree. When this pattern is transferred at low temperature of about 50° C. to about 80° C., a part of the wiring pattern may not be transferred but drop. When the Rz is kept to be 2 $\mu$m or more, transferring can be carried out steadily even at a low temperature of about 60° C. It is further preferable that the Rz is from 3 $\mu$m to 8 $\mu$m. When the value exceeds 8 $\mu$m, the components will be difficult to handle.

Though the both faces of the metal layer can be roughened, preferably the face for transferring is roughened further and the opposite face is smoother. When the wiring pattern is formed on the silicone resin layer, peeling performance at the time of transferring will be improved.

Thereby, the present invention includes formation of a wiring pattern on a silicone resin layer and roughening the surface of the wiring pattern facing the resin sheet for transferring so as to limit the roughening area. The synergistic effect enables wiring-pattern transferring at low temperature of, for example, 60° C. to 80° C.

The following description is about a wiring board to which the wiring pattern 104 is transferred. It is preferable that the sheet substrate 105 includes an inorganic filler and a thermosetting resin composition, and it has at least one viahole filled with a conductive paste 106. For example, JP11(1999)-220262 A discloses such a sheet substrate and a wiring board using the same. Thereby, it is possible to easily obtain a composite wiring board having an excellent thermal conductivity for a high density package having an innervia-hole (IVH) structure where the wiring pattern is electrically connected by the conductive paste 106. When this sheet substrate 105 is used, a high-temperature treatment during manufacturing the wiring board can be omitted. The required temperature is as low as about 200° C., that is, a curing temperature of the thermosetting resin.

It is preferable that the content of the inorganic filler with respect to the whole sheet substrate 105 is 70 wt % to 95 wt %, and the content of the thermosetting resin composition is 5 wt % to 30 wt %. It is particularly preferable that the content of the inorganic filler is 85 wt % to 90 wt %, and the content of the thermosetting resin composition 10 wt % to 15 wt %. Since the sheet substrate can contain a high concentration of the inorganic filler, the content of the inorganic filler can be varied to arbitrarily set the coefficient of thermal expansion, thermal conductivity, dielectric constant or the like of the wiring board.

It is preferable that the inorganic filler is at least one selected from the group consisting of $Al_2O_3$, MgO, BN, AlN, and $SiO_2$. By suitably determining the type of the inorganic filler, it is possible to set arbitrarily the coefficient of thermal expansion, thermal conductivity, dielectric constant or the like. For example, it is possible to set the coefficient of thermal expansion in the planar direction of the sheet substrate to a substantially same level as that of the semiconductor to be packaged, and to provide a high thermal conductance.

Among the above-mentioned inorganic fillers, for example, a sheet substrate 105 made of $Al_2O_3$, BN, AlN or the like has an excellent thermal conductivity, while a sheet substrate made of MgO has an excellent thermal conductivity and enables an increase in the coefficient of thermal expansion. When $SiO_2$ (particularly, an amorphous $SiO_2$) is used, the thus obtained sheet substrate is light-weight and has a low coefficient of thermal expansion and low dielectric constant. The inorganic filler can be used alone or at least two kinds of inorganic fillers can be used in combination.

The sheet substrate including the inorganic filler and the thermosetting resin composition is prepared, for example, in the following manner. First, a solvent for viscosity control is added to a mixture containing the inorganic filler and the thermosetting resin composition, thereby preparing a slurry having an arbitrary slurry viscosity. Examples of the solvent for viscosity control are methyl ethyl ketone and toluene.

The slurry is applied onto a previously formed separable film by a doctor-blade method or the like, and processed at temperature lower than a curing temperature of the thermosetting resin so as to volatilize the solvent. Subsequently, the separable film is removed, thereby providing a sheet substrate.

Generally, the thus obtained film has a thickness of 80 $\mu$m to 200 $\mu$m, though the thickness can vary depending on the components of the mixture and the amount of the solvent added for viscosity control. Though the condition for volatilizing the solvent is determined depending on the type of the solvent, the type of the thermosetting resin or the like, generally, the temperature range is 70° C. to 150° C., and the period is 5 minutes to 15 minutes.

In general, the separable film can be made of a synthetic resin film that is preferably an organic film containing, for example, at least one resin selected from the group consisting of polyethylene, polyethylene terephthalate (PET), polyethylene naphthalate (PEN), polyphenylene sulfide (PPS), polyphenylene phthalate, polyimide and polyamide. Among the resins, PPS is particularly preferred.

The material of the sheet substrate 105 is not limited to the above examples, but alternatively, it can be prepared by impregnating a thermosetting resin composition in a sheet reinforcer, and it can have at least one viahole filled with a conductive paste.

Though the sheet reinforcer is not particularly limited as long as it is a porous material that can retain the thermosetting resin, it is preferably a sheet reinforcer selected from the group consisting of a woven/nonwoven fabric of glass fibers, a woven/nonwoven fabric of heat-resistant organic fibers. Preferred examples of the heat-resistant organic fibers include all of the aromatic polyamides (aramid fibers), all of the aromatic polyesters, and polybutylene oxide. Aramid resin is preferred particularly.

Though the thermosetting resin is not limited specifically as long as it has heat resistance, from an aspect of excellent heat resistance, preferably it contains at least one resin selected from the group consisting of epoxy-based resin, phenol-based resin and cyanate-based resin or polyphenylene phthalate resin. The thermosetting resin can be used alone or at least two kinds of the resins can be combined in use.

Such a sheet substrate 105 can be prepared, for example, by impregnating the sheet reinforcer in the thermosetting resin composition and subsequently drying to semi-cure the composition.

It is preferable in the impregnation that the content of the thermosetting resin in the sheet substrate is 30 wt % to 60 wt %.

Alternatively, the sheet substrate 105 can be a green sheet containing an organic binder, a plasticizer and a ceramic powder, having at least one viahole filled with a conductive paste. This sheet substrate has excellent heat resistance, air tightness, and thermal conductivity.

It is preferable that the ceramic powder contains at least one ceramic selected from the group consisting of $Al_2O_3$, MgO, $ZrO_2$, $TiO_2$, BeO, BN, $SiO_2$, CaO and glass. Particularly a mixture containing $Al_2O_3$ of 50 wt % to 55 wt % and a glass powder of 45 wt % to 50 wt % is preferred. The ceramic can be used alone or at least two ceramics can be combined in use.

Examples of the organic binders include polyvinyl butyrate (PVB), acrylic resin, and methyl cellulose resin. Examples of the plasticizer include butylbenzyl phthalate (BBP) and dibutylphthalate (DBP).

The above-mentioned green sheet including the ceramic or the like can be prepared by the same method as the method of preparing a sheet substrate containing an inorganic filler and a thermosetting resin. The respective process conditions are determined suitably depending on the type of the material or the like.

In the second method of manufacturing the wiring board, it is preferable that the lamination of the wiring board is carried out by adhering the sheet substrate through application of heat and pressure, and firing the ceramic powder for sintering.

It is preferable that the sheet substrate 105 has a thickness of generally ranging from 50 $\mu$m to 250 $\mu$m.

As mentioned above, it is preferable that the sheet substrate has at least one viahole filled with a conductive paste. Thought the position of the viahole is not limited specifically as long as it is formed to be in contact with the wiring pattern. Preferably, plural viaholes are formed with an equal pitch of 250 $\mu$m to 500 $\mu$m.

Though the dimension of the viahole is not specifically limited, in general, the diameter is in a range of 100 $\mu$m to 200 $\mu$m, or more preferably, the diameter is 100 $\mu$m to 150 $\mu$m. Any specific problems will not occur even when a viahole with a diameter of 100 μm or less is used to correspond with the recent trend of fine wiring.

The method of forming the viahole is determined suitably depending on the type of the sheet substrate or the like. The examples include processes for using a carbon dioxide gas laser or a punching machine, and a batch process using a mold.

Though the conductive paste is not limited specifically as long as it has electrical conductivity, resins or the like containing particles of conductive metallic materials can be used in general. Examples of the conductive metallic materials include copper, silver, gold, silver-palladium, copper particles coated with silver, and a mixture thereof. Examples of the resins include thermosetting resins such as an epoxy-based resin, a phenol-based resin, and an acrylic resin. The content of the conductive metallic material in the conductive paste is in general 80 wt % to 95 wt %. When the sheet substrate is a ceramic green sheet, the thermosetting resin is replaced by glass and an acrylic binder.

In the present invention, a relationship between the heating temperature at the time of transferring the wiring pattern and the temperature of either curing-start of the conductive paste or the cure reaction peak is regarded as important. Definitions of the curing start temperature of the conductive paste and the cure reaction peak temperature are described below in detail.

Figure 3:
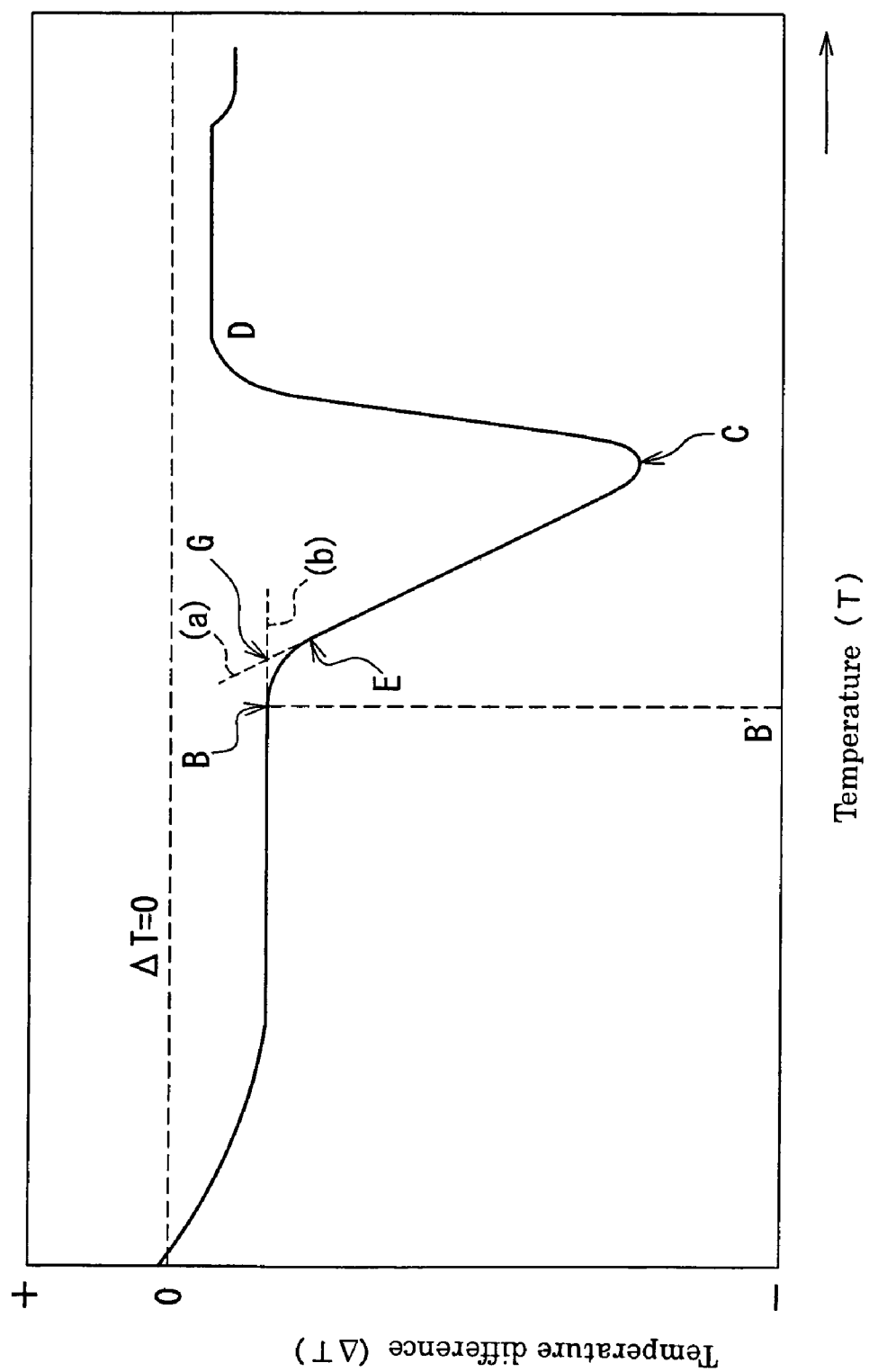
FIG. 3 is graph to show a cure reaction peak temperature and a curing start temperature for a conductive paste according to the present invention.

In the present invention, the curing start temperature of the conductive paste can be defined as mentioned below by referring to FIG. 3.

A conductive paste is subjected to a differential thermal analysis by raising the temperature from 30° C. to 250° C. (corresponding to a curing start temperature or higher) at a rate of 5° C./min. FIG. 3 is a graph schematically showing a differential thermal curve, where the x-axis denotes temperature (T) and the y-axis denotes a temperature difference ($\Delta T$). A rising point 'B' of the curve (a point where the $\Delta T$ starts to decline sharply) is determined regarding the position for indicating a peak of the curve (downward peak in FIG. 3). Next, a curing start temperature is defined as a temperature at a point 'G', which is an intersection of an extrapolation tangent (a) drawn at a point 'E' having a maximum inclination and an extrapolation tangent (b) drawn at a point 'B' and extending from the point 'B', between the point 'B' to the peak point 'C'. Then, the cure reaction peak temperature is defined as the temperature at the downward peak point 'C' in FIG. 3. In other words, the semi-cure reaction will proceed when the temperature exceeds the curing start temperature. When the temperature exceeds the cure reaction peak point, complete curing of the conductive paste will proceed. When the temperature is lower than the cure reaction peak, a complete curing will not be obtained though the semi-curing reaction may proceed. The cure reaction will not proceed at a temperature lower than the curing start temperature.

A thermal analysis measurement device (a differential thermal weight simultaneous measurement device 'TG/DTA 200' supplied by Seiko Instruments Inc.) can be used for obtaining the differential thermal curve. The above-mentioned curing start temperature and the cure reaction peak temperature can be calculated easily by using software provided with the device.

The curing start temperature and the cure reaction peak temperature of the conductive paste can be adjusted on the basis of the ingredients and amount of the resin, curing agent and curing accelerator in the conductive paste.

There is no specific limitation on the method of adhering the transferring wiring pattern material 100 and the sheet substrate 105, and a method of peeling, from the pattern transferring copper foil, the resin film 101 (supporter), the primer layer 102 and the silicone layer 103. For example, the process can be carried out as mentioned below when the sheet substrate 105 contains a thermosetting resin.

First, the transferring wiring pattern material 100 and the sheet substrate 105 are positioned together and subjected to heat and pressure so as to melt and soften the thermosetting resin in the sheet substrate, and to embed a metal layer 104 with a wiring pattern in the sheet substrate 105. Then, they are treated at a temperature for softening/curing of the thermosetting resin. For the case of curing, the resin is cured so that the transferring wiring pattern material 100 and the sheet substrate 105 are adhered and fixed.

Though there is no specific limitation on the condition for applying heat and pressure as long as the thermosetting resin is not cured completely, generally, the pressure is 10 kg/cm$^2$ to 100 kg/cm$^2$, the temperature is 50° C. to 120° C., and the time period is 1 minute to 120 minutes.

Namely, it is preferable that the transferring is carried out at a temperature at which curing of the conductive paste 106 will not proceed during a step of transferring the wiring pattern. That is, the present invention seeks to establish a condition of applying heat and pressure so as not to cure the conductive paste 106 completely. It is preferable that the heat is applied at a temperature lower than the cure reaction peak of the conductive paste, and more preferably, lower than the curing start temperature.

Specifically, the heating temperature will vary depending on the cure reaction peak temperature and curing start temperature of the conductive paste to be used. It is preferable that a typical conductive paste is heated at a temperature ranging from about 40° C. to about 80° C.

Furthermore, according to the present invention, the transferring process can be carried out at a temperature lower than the cure reaction peak of the conductive paste, or specifically at a temperature not higher than 80° C., thereby suppressing dimensional change of a PET film or the like having a relatively low glass transition temperature Tg. Films made of PET or PPS will experience dimensional changes due to moderation of the tensile stress as a result of heat treatment at generally about 100° C. Since a low temperature transferring process is applicable according to the present invention, substantially no dimensional change may occur even for these films, and thus choices for resin films for supporters can be increased remarkably. Namely, some processes such as heat treatment for suppressing dimensional change can be omitted.

A sheet substrate 105 made of a green sheet containing the ceramic can be prepared in the following manner. By applying heat and pressure as described above, a metal layer 104 for forming a wiring pattern is embedded in the sheet substrate 105 so as to adhere the sheet substrate and a wiring pattern material for transferring. Subsequently, as mentioned above, supporting layers 101, 102 and 103 are peeled so as to remove the wiring pattern material other than the metal wiring pattern layer 104 itself.

A constraint sheet that contains an inorganic composition as a main component that will not sinter-contract at a sintering temperature of the green sheet is prepared. The constraint sheet is arranged and laminated on at least one face of the green sheet on which the wiring pattern 104 has been transferred. This lamination step is followed by a binder-removing and firing processes, and subsequently, the constraint sheet is removed for forming a wiring pattern of a second metal layer, thereby forming a ceramic substrate.

The conditions for applying heat and pressure during the transferring can be determined suitably depending on, for example, the types of thermosetting resin contained in the conductive paste and the green sheet. In general, the pressure is 10 kg/cm$^2$ to 200 kg/cm$^2$, the temperature is 50° C. to 80° C., and the time is 2 minutes to 30 minutes. Since the wiring pattern can be transferred to the green sheet at a comparatively low temperature, the plasticity of the green sheet and also tackiness can be maintained. Therefore, the green sheet is not damaged, and the subsequent lamination step can be carried out easily.

The conditions of applying heat and pressure during a step of arranging and laminating the above-mentioned constraint sheet on at least one face of the green sheet formed with the wiring pattern are determined suitably depending on the type or the like of the thermosetting resin contained in the constraint sheet and the green sheet. In general, the pressure is 20 kg/cm$^2$ to 200 kg/cm$^2$, the temperature is 70° C. to 100° C., and the time period is 1 minute to 10 minutes. This manufacturing process is as same as those disclosed in, for example, JP05(1993)-10266 A and JP05(1993)-30819 A.

The condition for the binder-removing process is determined suitably depending on, for example, the type of the binder and metal for forming the wiring pattern. In general, it can be carried out by treating for 2 hours to 5 hours at temperature of 500° C. to 700° C., by using an electric furnace. Particularly, a copper foil wiring is prepared by, using a green sheet formed of an organic binder made of methacrylate-based acrylic resin binder or the like having an excellent pyrolytic property, and performing binder-removing and firing under a nitrogen atmosphere as an non-oxidative atmosphere.

The condition for the firing can be determined suitably depending on the type of the ceramic or the like. In general, the firing is carried out by using a belt furnace, in the air or nitrogen, at a temperature of 860° C. to 950° C. for 30 minutes to 60 minutes.

(Second Embodiment)

Figure 2B:
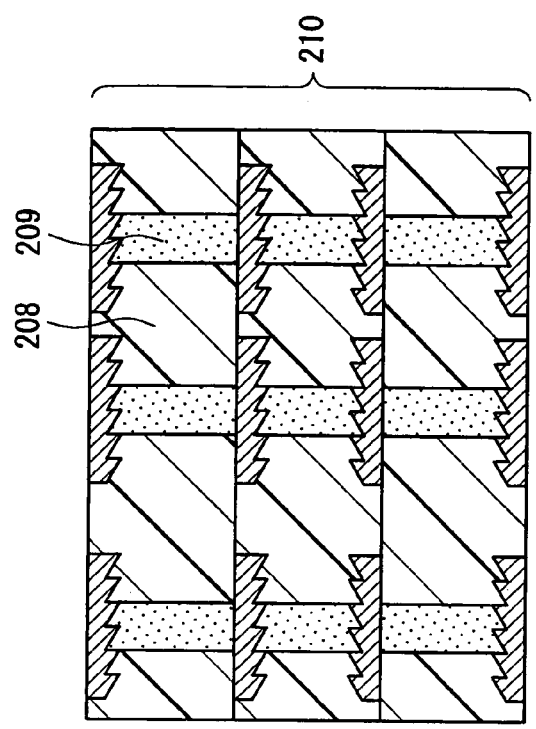
FIGS. 2A and 2B are cross-sectional views to show a multilayer wiring formed in a batch curing process according to a second embodiment of the present invention.
Figure 2A:
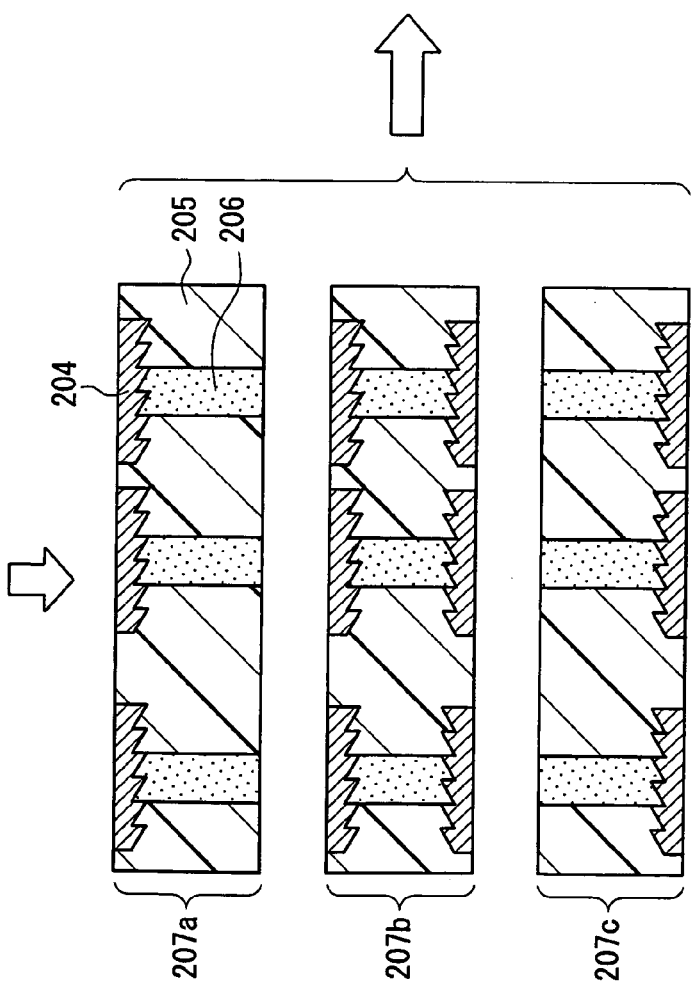

A method of manufacturing a wiring board is described further below by referring to FIGS. 2A and 2B. The wiring board includes a resin sheet on which a wiring pattern is formed by means of the transfer material. According to this method, a multilayer wiring board can be manufactured by laminating a monolayer or two-layer wiring substrate sheet that has been prepared, and by adhering the layers. Needless to note, the lamination can be carried out in a batch. FIGS. 2A an 2B show a process of preparing a two-layer (double-face) wiring substrate sheet and two monolayer wiring substrate sheets, arranging the monolayer wiring sheets on both faces of the two-layer wiring sheet, and laminating in a batch. The present invention is not limited to this batch lamination, but a plurality of monolayer sheets can be laminated on the two-layer wiring layer (an outermost layer). Alternatively, a conventional wiring board can be used for the two-layer wiring sheet. This conventional wiring board is provided as a finished product, and it can be a monolayer/multilayer ceramic wiring board or a resin wiring board.

For the next step of laminating wiring board sheets 207a, 207b and 207c including a sheet substrate 205 containing a thermosetting resin, similar to the first embodiment, a wiring pattern 204 is transferred alone, by applying heat and pressure, on the sheet substrate 205 filled previously with a conductive paste 206. Without curing the thermosetting resin, the thus obtained monolayer wiring board sheets 207a, 207b and 207c are laminated (FIG. 2A). The thus obtained laminate 210 is subjected to heat and pressure at a temperature for curing the thermosetting resin so as to cure the thermosetting resin, so that the wiring boards are adhered and fixed. As described in the first embodiment, the temperature of the condition for applying heat and pressure includes the temperature lower than the cure reaction peak temperature, so that the conductive paste 206 is not cured completely. When the wiring layer is transferred at a low temperature of not more than 100° C., further preferably, not more than 60° C., both the conductive paste and the sheet substrate maintain the semi-cure state even after transferring of the wiring pattern 204, and they can be treated as a prepreg. In FIG. 2B, 208 and 209 denote respectively a sheet and a cured conductive paste.

Since the conductive paste 206 remains substantially uncured like the prepreg, cure-connection can be carried out in a batch while correcting subtly all the vias simultaneously in the thickness direction. The thus obtained multilayer board has at least a four-layered board, with a highly reliable via-connection.

When considering a buildup substrate with a glass epoxy resin or the like for a core layer, the transferring material of the present invention is used for the sheet substrate, so that it will be possible to form a wiring pattern in an uncured state and to carry out a batch curing at the time of final lamination in a certain order.

When laminating the ceramic wiring board having the sheet substrate containing a ceramic, as mentioned above, a wiring pattern 204 is transferred alone on the sheet substrate 205, and then a monolayer/two-layer ceramic wiring board sheet is laminated before applying heat and pressure and firing the ceramic, so that the wiring boards are adhered and fixed.

Though the number of layers in the multilayer wiring board is not limited specifically, a typical board has 4 to 8 layers, or sometimes 12 layers. The multilayer wiring board has an entire thickness, in general, ranging from 500 μm to 1000 μm. The ceramic board used here can be a low-temperature fired ceramic that can be fired simultaneously with copper or silver. The examples are an alumina-based glass ceramic and Bi—Ca—Nb—O based ceramic.

EXAMPLES

The present invention will be explained further below by referring to Examples and Comparative Examples. Via-connection reliability was examined for the respective cases of using a resin-based transferring material made of the components shown in FIG. 1, cases of a wiring pattern transfer at various temperatures, and a case of forming multilayer wiring boards using resin sheets with the wiring patterns transferred thereon. Tables 1 and 2 indicate respectively the conditions and the results.

The following materials were used in Tables 1 and 2.
(1) Resin sheet having a thickness of 100 μm, made of silica (average particle diameter: 9 μm; the content: 83 mass %) and epoxy resin
(2) Copper foil component: Zn-plated and subjected to silane-coupling treatment
(3) Wiring pattern: line width (L)/space width (S) between lines=100/100 (μm)
(4) Via reliability: reliability for conditions of moisture absorption reflow of a four-layered board, where the via diameter is 150 μm and the land diameter is 300 μm, referring to JEDEC (USA Moisture Sensitivity Classifi cation (J-STD-020A) and Handling (J-STD-033) standard), level 1 (Note) In the table, 'A' indicates that the connection resistance does not vary substantially, 'B' indicates that the variation is within ±20, and 'C' indicates that the resistance varied, e.g., substantially doubled.

(5) Total reliability: 'good' indicates the dimensional change, the transfer performance and the via-connection reliability are good; 'faulty' indicates that at least one of the dimensional change, the transfer performance and the via-connection reliability is not good.

TABLE 1

| Nos.*¹ | Supporter | Glass transition point Tg (° C.) | Adhesive layer | Silane-coupling on carrier face Surface roughness Rz (μm) | Transfer-side copper foil surface roughness Rz (μm) | Adhesion strength (g/cm) | Transfer temperature (° C.) |
|---|---|---|---|---|---|---|---|
| Ex. 1 | PET | 67 | Silicone-based | Absence, Rz = 0.8 | 3.0 | 95 | 60 |
| Ex. 2 | PET | 67 | Silicone-based | Absence, Rz = 1.5 | 5.0 | 95 | 60 |
| Ex. 3 | PET | 67 | Silicone-based | Absence, Rz = 1.2 | 3.0 | 110 | 60 |
| Ex. 4 | PET | 67 | Silicone-based | Presence, Rz = 1.2 | 5.0 | 110 | 40 |
| Ex. 5 | PPS | 90 | Silicone-based | Presence, Rz = 1.3 | 5.0 | 80 | 60 |
| Ex. 6 | Polyimide | 210 | Silicone-based | Presence, Rz = 1.1 | 5.0 | 75 | 60 |
| Ex. 7 | PET | 67 | Silicone-based | Absence, Rz = 1.2 | 3.0 | 110 | 80 |
| Com. Ex. 1 | PET | 67 | Acrylic | Absence, Rz = 1.2 | 2.0 | 100 | 100 |
| Com. Ex. 2 | PET | 67 | Acrylic | Absence, Rz = 1.2 | 2.0 | 100 | 100 |
| Com. Ex. 3 | PET | 67 | Acrylic | Absence, Rz = 1.2 | 3.0 | 100 | 100 |
| Com. Ex. 4 | PET | 67 | Acrylic | Absence, Rz = 1.2 | 3.0 | 120 | 80 |
| Com. Ex. 5 | PET | 67 | Acrylic | Absence, Rz = 1.2 | 3.0 | 110 | 60 |
| Com. Ex. 6 | PPS | 90 | Silicone-based | Absence, Rz = 1.2 | 3.0 | 80 | 100 |
| Com. Ex. 7 | PPS | 90 | Silicone-based | Absence, Rz = 1.2 | 1.5 | 80 | 100 |
| Com. Ex. 8 | PPS | 90 | Silicone-based | Absence, Rz = 1.2 | 1.5 | 80 | 100 |
| Com. Ex. 9 | PET | 67 | Silicone-based | Absence, Rz = 1.2 | 1.5 | 90 | 100 |
| Com. Ex. 10 | PET | 67 | Silicone-based | Absence, Rz = 1.2 | 1.5 | 110 | 80 |
| Com. Ex. 11 | PET | 67 | Silicone-based | Absence, Rz = 1.2 | 1.5 | 95 | 60 |
| Ex. 8 | PET | 67 | Silicone-based | Absence, Rz = 0.6 | 2.0 | 95 | 60 |
| Ex. 9 | PET | 67 | Silicone-based | Absence, Rz = 0.7 | 2.5 | 95 | 60 |
| Com. Ex. 12 | PET | 67 | Silicone-based | Absence, Rz = 1.2 | 4.2 | 110 | 40 |
| Com. Ex. 13 | Co-polyester | 47 | Silicone-based | Presence, Rz = 1.1 | 5.0 | 80 | 60 |
| Com. Ex. 14 | Ethylene-vinyl acetate copolymer resin | 0 | Silicone-based | Presence, Rz = 1.3 | 5.0 | 80 | 60 |

*¹'Ex.' and 'Com. Ex.' respectively denote Example and Comparative Example.

TABLE 2

| Nos. | Dimensional change % | Transfer performance % | Via-connection reliability | Total reliability | Notes |
|---|---|---|---|---|---|
| Example 1 | 0.007 | 100 | A | Good | Untreated PET film |
| Example 2 | 0.007 | 100 | A | Good | Untreated PET film |
| Example 3 | 0.009 | 100 | A | Good | Untreated PET film |
| Example 4 | 0.005 | 100 | A | Good | Untreated PET film |
| Example 5 | 0.008 | 100 | A | Good | Untreated PPS film |
| Example 6 | 0.005 | 100 | A | Good | Untreated polyimide film |
| Example 7 | 0.05 | 100 | A | Good | Untreated PET film |
| Com. Ex. 1 | 0.01 | 34 | C | Faulty | Heat-treated PET |
| Com. Ex. 2 | 0.01 | 98 | C | Faulty | Heat-treated PET |
| Com. Ex. 3 | 0.01 | 100 | C | Faulty | Heat-treated PET |
| Com. Ex. 4 | 0.01 | 98 | C | Faulty | Ditto for PET, acrylic residue generaton |
| Com. Ex. 5 | 0.01 | 90 | C | Faulty | Ditto for PET, acrylic residue generaton |
| Com. Ex. 6 | 0.12 | 90 | C | Faulty | Untreated PPS fllm |
| Com. Ex. 7 | 0.12 | 100 | C | Faulty | Untreated PPS fllm |
| Com. Ex. 8 | 0.12 | 100 | C | Faulty | Untreated PPS fllm |
| Com. Ex. 9 | 0.14 | 100 | C | Faulty | Untreated PET fllm |
| Com. Ex. 10 | 0.05 | 98 | B | Faulty | Untreated PET fllm |

TABLE 2-continued

| Nos. | Dimensional change % | Transfer performance % | Via-connection reliability | Total reliability | Notes |
|---|---|---|---|---|---|
| Com. Ex. 11 | 0.007 | 92 | A | Faulty | Untreated PET film |
| Example 8 | 0.007 | 95 | A | Fair | Untreated PET film |
| Example 9 | 0.007 | 98 | A | Fair | Untreated PET film |
| Com. Ex. 12 | 0.009 | 91 | A | Faulty | Untreated PET film |
| Com. Ex. 13 | 0.17 | 100 | A | Faulty | Untreated polyester film |
| Com. Ex. 14 | 0.45 | 100 | C | Faulty | Untreated film, generation of displacement between via and land electrode |

(Supplementary Explanation for Tables 1 and 2)
Acrylic adhesive: 'Y-650' (trade name) supplied by Cemedine Co., Ltd.
Polyester film (carrier film): 'Type 770' (trade name) with a thickness of 75 μm supplied by Teijin DuPont Films Japan Ltd.
Silicone-based adhesive: 'SE1720CV' supplied by Dow Corning Toray Silicone Co., Ltd.

In the respective Examples, the glass transition points (Tg) of the resin films used for the supporters for the transferring materials were varied for checking mainly the influences on the dimensional change. For the adhesive layer, silicone layers were formed in the present invention, and sticky acrylic materials were used in the comparative examples. A primer layer used for the case of silicone layer was made of acetoxysilyl-based monomer.

The copper foil used for the metal foils for the wiring patterns was a double-sided shiny copper foil of 12 μm and a single-sided roughened copper foil of 12 μm. The copper foil on the matte-face is subjected only to a silane-coupling as a surface treatment. Though the copper foil thickness was 12 μm, a copper foil having a thickness of 9 μm or 18 μm can provide normal transfer performance and via connectivity.

The conductive paste in the present invention was an epoxy-based conductive paste consisting of filler of Cu particles coated with Ag. The details are below.

(Conductive Paste)
(1) Cu particles (supplied by Mitsui Mining and Smelting Co., Ltd., average diameter is 2 μm): 85 wt %
(2) Bisphenol F type thermosetting epoxy resin (supplied by Yuka Shell Epoxy with a trade name of 'Epikote 807'): 7 wt %
(3) Novolac phenol resin ('BRG558' supplied by Showa Highpolymer): 3 wt %
(4) Butylcarbitol supplied by Japan Alcohol Trading CO., LTD.: 5 wt %

To the totally 100 weight parts of the above components, 1 weight part of 2-ethyl-4-methyl imidazole as a curing accelerator was added, and the mixture was kneaded with a three-roll mill so as to provide a paste.

The cure reaction peak temperature was 100° C. and the curing start temperature was 90° C. in a measurement based on a differential thermal analysis (DTA), using the above-mentioned methods and apparatuses.

In the Examples, resin sheets for transferring were made of silica and epoxy resin, and each of the sheets had a thickness of 100 μm.

(Ingredients of the Material Used for Preparing Resin Sheets)
(1) $SiO_2$ (molten silica supplied by Mitsubishi Rayon Co., Ltd. with a trade name of 'Silica Ace QS-9', the average particle diameter is 9 μm): 83 wt %
(2) Liquid thermosetting epoxy resin ('EF-450' supplied by Japan REC Co., Ltd.): 16.5 wt %
(3) Carbon black supplied by Toyo Carbon: 0.2 wt %
(4) Coupling agent (titanate-coupling agent '46B' supplied by AJINOMOTO CO., INC.): 0.3 wt %

The respective ingredients were measured and mixed. Methyl ethyl ketone as a viscosity control solvent was added to the mixture so that the mixture had a slurry viscosity of about 20 Pa·s. Next, alumina balls were added to the mixture, and the mixture was rotated at a velocity of 500 rpm for blending for 48 hours in a pot, so that a slurry as a material of an insulating sheet was prepared. Subsequently, the slurry was coated to form a film by a doctor blade method and dried, so that a resin sheet having a thickness of 100 μm was obtained.

In the examples, the wiring patterns were used for evaluating the via-connection. The adopted pattern was L/S=100/100. The via diameter and the land diameter were set to be 150 μm and 300 μm, respectively. The substrate used for the via-connection evaluation indicates a result of a four-layer board formed by a batch curing in a transferring process as shown in FIG. 2.

The via-connection reliability shown in Table 1 indicates via-connection resistance at the time of 260° C. reflow (JEDEC level. 1) corresponding to a Pb-free solder after a moisture absorption step in an atmosphere of 85° C., 85 Rh, and 168 hr.

The failures in Example 8 occurred during a dot-type pattern transferring. If limited to the wiring pattern, substantially complete transferring performance was obtained when the transfer rate is 95% or higher in each of the Examples.

Among the samples indicated in Table 1, Comparative Examples 1–5 use sticky acrylic materials for the adhesive layers. PET films as supporters are heated previously at 130° C. for suppressing dimensional change. As a result, by roughening the transfer faces of the copper foils, substantially complete transferring performance at a temperature of about 100° C. is secured. However, the transfer performance will deteriorate at some parts when the transfer temperature is lowered. Furthermore, for via-connection in any of the structures of the Examples, the conductive paste will be cured partly at the curing temperature of 100° C., which will increase resistance conversion in via-connection resistance at the time of moisture absorption reflow after a batch curing. Moreover, at the time of transferring to the resin sheet, the acrylic resin as an adhesive layer will be peeled and attached thereto, affecting the via-connection.

In the samples shown in the Comparative Example 6 and the following ones, the adhesive layers contain silicone resin. The transfer performance was improved remarkably by modifying the transfer-face of the copper foil from a shiny face to a matte face (see Comparative Examples 6 and 7). Even when the transfer performance was improved at each temperature due to the use of the silicone adhesive layers, transfer failure still occurs at 60° C. (see Comparative Examples 6–11). However, by raising the roughening degree Rz, the pattern transfer performance was improved even at 60° C. For the cases of PPS films (Tg=90° C.) and PET films, the dimensional change was considerable at 100° C. if heating was not carried out before the transferring step. As a result, failures occurred in uses for semiconductor packages or the like. On the other hand, a PET film (Tg=67° C.) had substantially no dimensional change during a 60° C. transferring step.

In Example 4, the copper foil was subjected to a silane-coupling treatment on the shiny face for facing the adhesive layer. When the transfer temperature was lowered to 40° C., the transfer performance in Example 4 was improved further.

When the copper foil surface roughness (Rz) of the matte face was 3 μm or more, transferring was carried out securely at 60° C. as shown in Example 1. Similarly, in Example 4, the transfer performance was substantially 100%.

For changing Tg of the supportive film, the PET film (Tg=67° C.) was replaced by a copolymeric polyester resin (Biomax® supplied by DuPont, Tg=47° C.) in Comparative Example 14, by an ethylene-vinyl acetate copolymer resin film (Tg=0° C. in Comparative Example 15, by PPS (Tg=90° C.) in Example 5, and by a polyimide film (Tg=210° C.) in Example 6. Transferring to resin sheets was carried out at 60° C. In Comparative Examples 14 and 15 where the Tg of the supporters was equal to or lower than the transfer temperature, the dimensional change was as great as 0.1% or more, resulting in failures. In Examples 5 and 6 where the Tg of the supporters was 60° C. (transfer temperature) or higher, the dimensional change was 0.01% or less, i.e., the result was satisfactory.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A transfer sheet comprising a resin film having a glass transition temperature of not lower than 60° C., a silicone resin layer formed on the resin film, and a metal wiring pattern formed on the silicone resin layer,
    wherein the metal wiring pattern has roughnesses on both surfaces, the surface of the metal wiring in contact with the silicone resin layer has a surface roughness (Rz) in the range from 0.5 μm to 1.5 μm and the surface roughness on an exposed surface is in the range from 3.0 μm to 8.0 μm, and wherein at least one of the surfaces of the wiring pattern is plated with zinc.

2. The transfer sheet according to claim 1, wherein the metal wiring pattern is made of a copper foil.

3. The transfer sheet according to claim 1, wherein the resin film comprises polyethylene terephthalate.

4. The transfer sheet according to claim 1, wherein the surface of the wiring pattern is provided with a silane-coupling agent.

5. The transfer sheet according to claim 1, further comprising a primer layer interposed between the resin film and the silicone resin layer.

6. The transfer sheet according to claim 1, wherein the metal wiring has a thickness in the range from 9 μm to 35 μm.

* * * * *